(12) United States Patent
Cheng et al.

(10) Patent No.: US 7,257,041 B2
(45) Date of Patent: Aug. 14, 2007

(54) MEMORY CIRCUIT AND RELATED METHOD FOR INTEGRATING PRE-DECODING AND SELECTIVE PRE-CHARGING

(75) Inventors: Chi-Ting Cheng, Taipei Hsien (TW); Po-Yo Tseng, Taipei Hsien (TW)

(73) Assignee: VIA Technologies Inc., Hsin-Tien, Taipei Hsien (TW)

( * ) Notice: Subject to any disclaimer, the term of this patent is extended or adjusted under 35 U.S.C. 154(b) by 0 days.

(21) Appl. No.: 11/277,044

(22) Filed: Mar. 21, 2006

(65) Prior Publication Data

US 2006/0239092 A1 Oct. 26, 2006

Related U.S. Application Data

(60) Provisional application No. 60/594,652, filed on Apr. 26, 2005.

(51) Int. Cl.
*G11C 7/00* (2006.01)
(52) U.S. Cl. .................. 365/203; 365/230.02
(58) Field of Classification Search ............. 365/203, 365/230.02
See application file for complete search history.

(56) References Cited

U.S. PATENT DOCUMENTS 5,208,773 A * 5/1993 Okitaka et al. ........ 365/189.04
5,828,610 A 10/1998 Rogers
6,233,186 B1 5/2001 Tonda
6,233,193 B1 * 5/2001 Holland et al. ............. 365/222
6,542,401 B2 * 4/2003 Yamauchi et al. .......... 365/154
6,671,216 B2 12/2003 Rogenmoser
2002/0034101 A1 * 3/2002 Semi ..................... 365/185.23
2002/0089879 A1 * 7/2002 Kobayashi et al. .... 365/189.01
2002/0105826 A1 * 8/2002 Yamauchi et al. .......... 365/154
2003/0002382 A1 1/2003 Kumar
2006/0164895 A1 * 7/2006 Sato ........................... 365/203

FOREIGN PATENT DOCUMENTS

TW        1220528        8/2004

* cited by examiner

*Primary Examiner*—Michael T Tran
(74) *Attorney, Agent, or Firm*—Winston Hsu

(57) ABSTRACT

In a memory circuit, memory cells are arranged in a matrix by "row line-and column line" (may also denoted as "word line and bit line"). The invention provides a memory circuit and related method capable for independently pre-charging the column lines or bit lines selectively during data accessing according to results of column pre-decoding to decrease the pre-charging power consumption. After pre-charging, the objective memory cell is enabled to change or not to change the corresponding electric level of the connected column line according to the stored data, and a sense amplifier detects the stored data by measuring the electric level of the column line.

16 Claims, 4 Drawing Sheets

MEMORY CIRCUIT AND RELATED METHOD FOR INTEGRATING PRE-DECODING AND SELECTIVE PRE-CHARGING

CROSS REFERENCE TO RELATED APPLICATIONS

The application claims the benefit of U.S. Provisional Application No. 60/594,652, filed Apr. 26, 2005, and included herein by reference.

BACKGROUND OF THE INVENTION

1. Field of the Invention

The present invention is related to a memory circuit and related method for integrating pre-decoding and selective pre-charging, especially to a memory circuit and related method for independently pre-charging or not pre-charging various column lines (or bit lines) selectively according to results of performing column pre-decoding during data accessing to decrease the pre-charging power consumption.

2. Description of the Prior Art

In the present society, various documents and data can be stored in forms of electrical signals to be transmitted, managed, and stored. Various types of memory (or memory circuits) capable of performing data accessing have become necessary for various electronic devices or information devices. Moreover, read-only memory circuits can be utilized in several fields since the read-only memory circuits can store data in a non-volatile manner. For example, read-only memory circuits are set in digital signal processing circuits (or chips) or in signal encoding/modulation chips disposed inside the cell phones to store codes or other necessary parameters and vectors. Along with the broad usage of the read-only memory circuits, further development of read-only memory circuits has become a research topic for those in the field.

As known by those skilled in the art, a plurality of memory cells are disposed inside a memory circuit to respectively store one bit of data. The memory cells can be arranged in matrix by "row line and column line" (may also be replaced as "word line and bit line"). A given bit line is selectively and electrically connected to a sense amplifier of the memory circuit, so that the electrical signal of the connected bit line can be transmitted to the sense amplifier through the bit line. Electronic signals of other bit lines which are not electrically connected to the sense amplifier can't be transmitted to the sense amplifier. Then one memory cell of a given word line is enabled, so that the memory cell at the intersection of the given word line and the given bit line can transmit the stored data to the sense amplifier, and the data of the memory cell can thus be accessed.

More concretely, in a read-only memory circuit, memory cells with different stored data respectively have different electronic conductivity (such as currents) to the connected bit lines. While performing the aforementioned data accessing, after enabling the objective memory cell by the given word line, the connected bit line of the objective memory cell is conducted, so that the electronic level (such as voltage level) of the bit line is changed or not changed according to the stored data of the memory cell. Moreover, the voltage level is transmitted to the sense amplifier by the electronic connection between the given bit line and the sense amplifier, so that the sense amplifier determines the stored data of the objective memory cell according to the voltage level. Equally, the stored data of the memory cell is transmitted to the connected bit line after the memory cell is enabled.

For the above accessing method, the bit line should be pre-charged to a default voltage level before enabling the objective memory cell. After enabling the objective memory cell, if the objective memory cell has a high conductivity, the voltage level of the corresponding bit line can be pulled down from the default voltage level to a lower voltage level. Then the sense amplifier determines that digital bit "0" is stored in the memory cell. Otherwise, if the voltage level of the corresponding bit line is maintained in the range of the default voltage level, the sense amplifier determines that the conductivity of the memory cell is significantly low, and the digital bit "1" is stored in the memory.

In other words, pre-charging the bit line (or the column line) is necessarily for data accessing in the memory circuit, especially for read-only memory circuits. However, in the conventional read-only memory circuit, all the bit lines (or column lines) in the matrix of the memory cells are pre-charged while accessing. Even if only one memory cell on single bit line is accessed, all the bit lines have to be pre-charged to the default voltage level. As a result, more power is consumed to pre-charge when accessing data in the conventional read-only memory circuit. Therefore, it is not beneficial for low power operation.

SUMMARY OF THE INVENTION

Therefore, the invention provides a memory circuit and related method capable for independently pre-charging the column lines or bit lines selectively during data accessing according to results of column pre-decoding to decrease the pre-charging power consumption. As a result, the memory circuit or read-only circuit can perform data accessing consuming lower power.

The invention provides a memory circuit includes: a plurality of memory cells which form a plurality of column lines and a plurality of row lines; each column line has a corresponding pre-charge unit and a corresponding control unit, the control unit controls the pre-charge unit to pre charge or not to pre charge the corresponding column line. A column pre-decoder for providing a selection signal corresponding to one of the column lines; and a multiplex module having a multi-level accessing module connected to the column line, wherein the multiplex module receives the selection signal, and determines to pre charge or not to pre charge the column line according to the selection signal.

The invention also provides a method for operating a memory circuit, wherein the memory circuit includes a plurality of column lines, and each column line is connected to at least one corresponding memory cell. The method includes: decoding the column line of a given objective memory cell while accessing; and only pre charging the column line of the objective memory cell.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
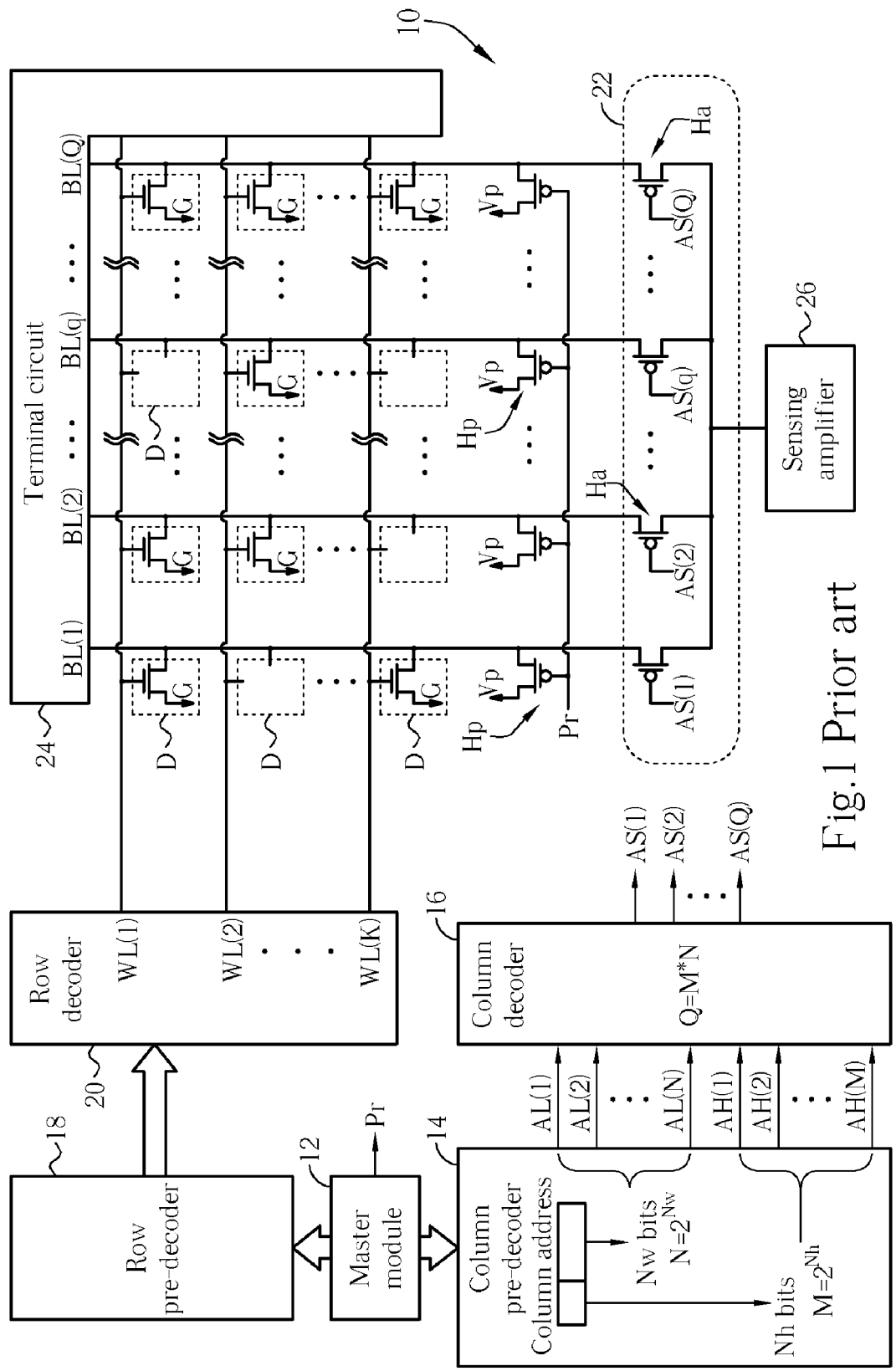
FIG. 1 is a schematic diagram of the conventional memory circuit.

Please refer to FIG. 1, which is a schematic diagram of the conventional memory circuit 10.

The memory circuit 10 is a read-only circuit including a plurality of memory cells D, for respectively storing one bit data. By the connection of the row lines (or the word lines) WL(1)~WL(K) and the column lines (or the bit lines) BL(1)~BL(Q), the plurality of memory cells D form a matrix. The memory circuit 10 also includes a master module 12, a column pre-decoder 14, a column decoder 16, a row pre-decoder 18, a row decoder 20, a terminal circuit 24, and a sense amplifier 26. Moreover, each column lines BL(1)~BL(Q) respectively includes a pre-charge unit Hp and an accessing unit Ha. Master module 12 controls the operations of the memory circuit 10, such as providing a pre-charging signal Pr to control the timing of pre-charging. The terminal circuit 24 includes some related circuits for supporting the matrix, such as dummy cells, impedance matching circuits, or bias circuits.

In FIG. 1, memory cell D programs the stored data according to whether a metal-oxide semiconductor existed in the memory cell D. The memory cell D having a metal-oxide semiconductors (for example, the memory cell D at the intersection of the row line WL(1) and the column line BL(1)), would have high conductivity after being enabled, so that the memory cell could store digital bit "0". On the contrary, the memory cell D having no metal-oxide semiconductor (for example, the memory cell at the intersection of the row line WL(2) and the column line BL(1)), would have no conductivity even after being enabled, so that the memory cell could store digital bit "1".

In the matrix, accessing unit Ha of each column line controls whether the corresponding column line is enabled or not to electrically connected to the sense amplifier. The accessing unit Ha, for example, is a metal-oxide semiconductor. All of the accessing units of column lines is regarded as a multiplex module 22. In the memory circuit 10 of FIG. 1, pre-charge unit Hp of each column line is controlled by the pre-charging signal Pr asserted by the master module 12. The pre-charge unit Hp, for example, is a metal-oxide semiconductor.

The column pre-decoder 14 and the column decoder 16 perform the column decoding mechanism. The row pre-decoder 18 and the row decoder 20 perform the row decoding mechanism.

Take the column decoding mechanism as an example. Assume there have Q column lines in the memory circuit 10 and Q is substantially equal to $2^{(N_h+N_w)}$, thus each column line can be addressed by column address of ($N_h+N_w$) bits. Wherein, Q, $N_h$ and $N_w$ are integer. The column address has high-level address of $N_h$ bits and low-level address of $N_w$ bits. The column pre-decoder 14 respectively generates M signals AH(1)~AH(M) and N signals AL(1)~AL(N) after decoding the high-level address and the low-level address. Wherein M is substantially equal to $2^{N_h}$, and N is substantially equal to $2^{N_w}$. The column decoder 16 respectively provides signals AS(1)~AS(Q) to the corresponding Q column lines, according to signals AH(1)~AH(M) and signals AL(1)~AL(H). Furthermore, signals AS(1)~AS(Q) respectively control the enable of the accessing unit Ha on each column line BL.

While decoding a column address, only one signals AH(1)~AH(M) of the column pre-decoder 14 is enabled and the other signals are all disabled. Similarly, only one signals AL(1)~AL(N) is enabled and the other signals are all disabled. Therefore, the column address can be indicated by a certain line (one of AL signal) of a certain set (one of AH signal). The column decoder 16 further indicates which column line of the Q column lines is by decoding the indicated signals AH(~) and AL(~). For example, assume the signal AH(m0) is enabled and the signal AH(n0) is also enabled (m0 is an integer between 1 to M, and n0 is an integer between 1 to N), which means the column address is the n0-th column line of the m0-th set. Therefore, the column decoder 16 enables the signal AS(n0+(m0−1)*M) from signals AS(1)~AS(Q), and disable the other signals. The enabled signal AS(n0+(m0−1)*M) conducts the accessing unit Ha of the (n0+(m0−1)*M)-th column line.

The operation of the row decoding mechanism is similar. The row decoding mechanism enables one of the row lines from WL(1) to WL(K) by decoding the signals. Thus, each memory cell connected to the enabled row line is also enabled.

The operation of the conventional memory circuit 10 of FIG. 1 is described as follows.

When accessing an addressed memory cell D, the master module 12 firstly enables and conducts each pre-charge unit Hp of all column lines by enabling the pre-charge signal Pr. Since the pre-charge unit Hp is biased in Vp (for example, a high-level voltage), voltage level of all column lines BL(1)~BL(Q) are pre-charged to approximate Vp. Secondly, the master module 12 disables the pre-charge signal Pr and thus each pre-charge unit Hp stops pre charging. Then, the column decoder 16 electronically connects the column line of the addressed memory cell D to the sense amplifier 26 by a signal AS(~). The row decoder 20 enables the row line of the addressed memory cell D, so that the sense amplifier 26 detects the column line of the address memory cell D and reads out the stored data of the memory cell D according to the voltage level of the column line.

For example, assume the memory cell locates at the intersection of the column line BL(1) and the row line WL(1) is addressed. After pre charging, the column line BL(1) is electrically connected to the sense amplifier 26 by enabling the accessing unit Ha. And then the row line WL(1) is also enabled, so that the memory cell located at the intersection of the column line BL(1) and the row line WL(1) is enabled accordingly. Since there has a metal-oxide semiconductor in the memory cell located at the intersection BL(1) and WL(1), the voltage level of the column line BL(1) is reduced to approximate the biased voltage G (for example, the ground voltage) due to the conducted metal-oxide semiconductor. The sense amplifier 26 detects the reduced voltage level of the column line and thus the digital bit "0" is read out from the memory cell. On the contrary, assume the addressed memory cell locates at the intersection of the column line BL(2) and the row line WL(K). Since there is no metal-oxide semiconductor in the memory cell, thus no the memory cell is conducted after pre charging even if the memory cell is enabled by the row line WL(K). The voltage level of the column line BL(2) maintains at the approximately high voltage level of pre-charge. Therefore, the sense amplifier 26 detects the stored data is digital bit "1".

As mentioned above, the pre-charge is necessary for access. However, in the conventional memory circuit 10 of FIG. 1 all column lines is pre charged while access data without considering whether the memory cell is accessed or not. Therefore, power consumption is increased.

As known by those skilled in the art, each memory cell of the memory circuit has a corresponding address.

While one objective memory cell needs to be accessed, the memory circuit performs row decoding and column decoding for the address of the objective memory cell so as to find out the corresponding connecting word line and the bit line (i.e., the row line and the column line). Generally speaking, for decreasing the complexity the row decoding and the column decoding circuits, a pre-decoding mechanism is performed firstly to locate the row line and the column line of the objective memory cell.

Figure 2:
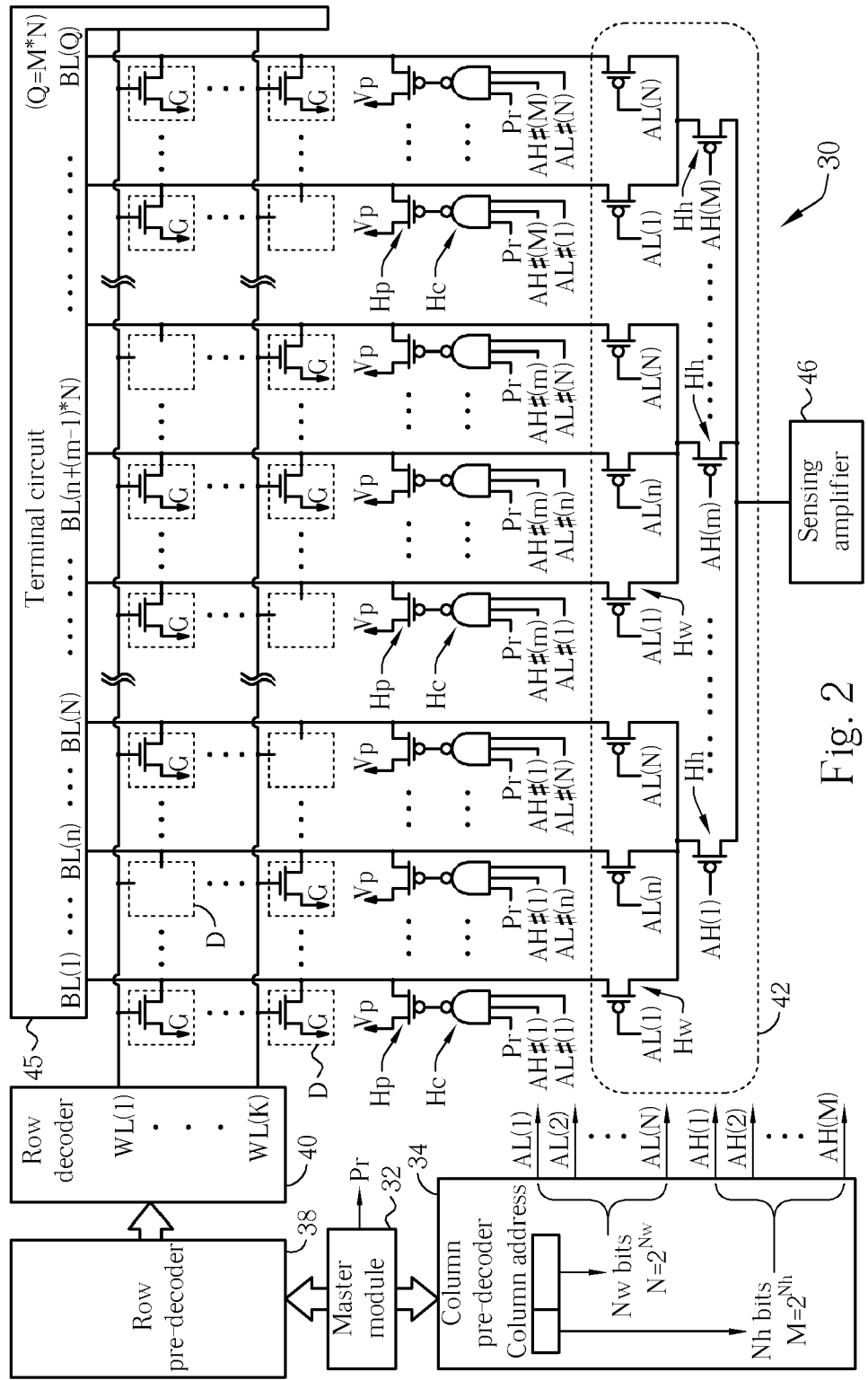
FIG. 2 is a block diagram of the memory circuit of the present invention.

Please refer to FIG. 2, which shows a block diagram of a memory circuit 30 of the present invention. The memory circuit 30 of the present invention selectively pre charges the column line to reduce power consumption. The memory circuit 30 is, for example, a read-only memory circuit. The memory circuit 30 includes: a master module 32, a column pre-decoder 34, a row pre-decoder 38, and a row decoder 40. The memory circuit 30 also includes a plurality of memory cells D arranged in form of a matrix by the column line BL(1)~BL(Q) and row line WL(1)~WL(K), a terminal circuit 45 for supporting the matrix, and a sense amplifier 46. The master module 32 controls operations of the memory circuit 30 and coordinates periods of each function block of the memory circuit 30. For example, the master module 32 controls the pre-charge timing by a pre-charge signal Pr.

In the memory circuit 30 of the present invention, the row pre-decoder 38 and the row decoder 40 perform the row decoding mechanism. In the present invention, the column decoding mechanism, the pre-charge mechanism and the column multiplexing mechanism are integrated, as a result, there only has the column pre-decoder 34 in the memory circuit 30. The column pre-decoder 34 separates the column address of $(N_h+N_w)$ bits into a high-level address of $N_h$ bits and a low-level address of $N_w$ bits. After pre decoding the high-level address and the low-level address, the corresponding signals AH(1)~AH(M) and AL(1)~AL(N) are provided, wherein M is $2^{Nh}$, and N is $2^{Nw}$. Corresponding to the signals AH(~) and AL(~), a low level accessing unit Hw (for example, a p-type metal-oxide semiconductor) is respectively disposed on each column line BL(1)~BL(Q). In the present invention, every N column lines are grouped into a set and connected to a high-level accessing unit Hh (for example, a p-type metal-oxide semiconductor). For example, the column lines BL(1)~BL(N) are connected to the accessing unit Hh$_1$, and the column lines BL(N+1)~BL(2*N) are connected to another accessing unit Hh$_2$ and so on. For a set formed by N column lines, the signals AL(1)~AL(N) respectively control the corresponding low level accessing unit Hw, and the signals AH(1)~AH(M) respectively control the corresponding high level accessing unit Hh. All the high level accessing units Hhs and all the low level accessing units Hws form a multi level multiplex module 42.

As shown in FIG. 2, for the column line BL(n+(m−1)*M), since the corresponding high level accessing unit Hh and low level accessing unit Hw are respectively controlled by signal AH(m) and AL(n). The high level accessing unit Hh and the low level accessing unit Hw of the column line are both conducted only when both of the signals AH(m) and AL(n) are enabled, and then the column line is electrically connected to the sense amplifier 46. Therefore, signal {AH(m), AL(n)} is regarded as a selection signal of the column line BL(n+(m−1)*M). In other words, while accessing the memory cells, if both of the signals AH(m) and AL(n) of the selection signal {AH(m), AL(n)} are enabled, thus the memory cells on the column line BL(n+(m−1)*M) are electrically connected to the sense amplifier 46, and it means that the objective memory cell is on the column line BL(n+(m−1)*M). Otherwise, if there is at least one signal of the selection signal disabled, thus the corresponding high level accessing unit Hh or/and the low level accessing unit Hw of the column line BL(n+(m−1)*M) is not conducted. Thus the memory cells on the column line BL(n+(m−1)*M) are not electrically connected to the sense amplifier 46, which means the objective memory cell is not on the column line BL(n+(m−1)*M).

The column decoding mechanism and the column multiplexing mechanism are integrated in the present invention. In the memory circuit 30, the selective pre-charge mechanism is implemented by pre-charge units Hp (e.g. a p-type metal-oxide semiconductor with the biased source voltage Vp) and the corresponding control units Hc of each column lines. As the mention above, a corresponding selection signal of one column line shows whether the objective memory cell is on the column line. In the present invention, only the column line of the objective memory cell is pre charged. Therefore, the corresponding control units Hc of each column lines respectively control the corresponding pre-charge units Hp to perform the pre-charge mechanism according to the corresponding selection signals and the pre-charge signal Pr. For example, a control unit Hc of the column line BL(n+(m−1)*M) controls the corresponding pre-charge unit Hp to pre charge the column line BL(n+(m−1)*M) according to the corresponding selection signal {AH(m), AL(n)} and the pre-charge signal Pr. If the selection signal {AH(m), AL(n)} is enabled (i.e. both signals AH(m) and AL(n) are enabled which means the objective memory cell is on the column line BL(n+(m−1)*M), thus the column line BL(n+(m−1)*M) is pre charged when the pre-charge signal Pr is also enabled by the master module 32. Otherwise, if the selection signal {AH(m), AL(n)} is disabled (i.e. one of signals AH(m) and AL(n) is disabled), which means the objective memory cell is not on the column line BL(n+(m−1)*M), thus the column line BL(n+(m−1)*M) is not pre charged even if the pre-charge signal Pr is enabled by the master module 32.

The pre-charge unit Hp performs the per-charge mechanism only when the selection signal and the pre-charge signal are both enabled (i.e. if all signals of the selection signal are enabled, then the selection signal is enabled). The control unit Hc would disable the pre-charge unit Hp when any one of the selection signal and the pre-charge signal Pr is disabled (i.e. if any one of signals of the selection signal is disabled then the selection signal is disabled); as a result, the pre-charge mechanism wouldn't be performed. Therefore, unnecessary power consumption is prevented.

In the embodiment of FIG. 2, assume all the high-level accessing units and low-level accessing units are respectively implemented with a p-type metal-oxide semiconductor, as a result, the low voltage level signals AH(~)/AL(~) respectively enable the corresponding accessing units Hh/Hw, and the high voltage level signals AH(~)/AL(~) respectively disable the corresponding accessing units Hh/Hw. Otherwise, the pre-charge signal Pr is enabled when in a high voltage level signal and disabled when in a low voltage level signal. Each control units Hc of FIG. 2 is for example an NAND gate and performs an NAND operation with the corresponding selection signal and the pre-charge signal.

Take the column line BL(n+(m−1)*M) as an example, the control unit Hc performs an NAND operation with the per-charge signal Pr and the inverse of the signals AH(m), AL(n) (i.e. the inverse of the signals AH(m), AL(n) are denoted as AH#(m), AL#(n) respectively in FIG. 2). Then the control unit Hc controls the pre-charge unit Hp, a p-type metal-oxide semiconductor, according to the NAND operation result. When AH(m), AL(n), and the pre-charge signal Pr are all enabled, AH#(m), AL#(n), and the pre-charge signal Pr are all at a high voltage level, the NAND operation result of AH#(m), AL#(n), and the pre-charge signal Pr is at a low voltage level, Therefore, the corresponding pre-charge unit Hp is conducted and begins to perform the pre-charge mechanism. If at least one signal of AH(m), AL(n), and Pr is disabled which means there has at least one signal of AH#(m), AL#(n), and Pr is at a low voltage level. Thus, control unit Hc is at a high voltage level and the corresponding pre-charge unit Hp wouldn't be conducted so that the pre-charge mechanism wouldn't be performed.

Another example is assumed that the memory cells form a matrix by 32 column lines, and each column line is addressed by 5 bits (32 is equal to 25). The 32 column lines are further separated into 4 groups for each group having 8 column lines. In other words, the first group has 8 column lines from the $1^{st}$ column line to the $8^{th}$ column line; the second group is from the $9^{th}$ column line to the $16^{th}$ column line; the third group is from the $17^{th}$ column line to the $24^{th}$ column line; and the fourth group is from the $25^{th}$ column line to the $31^{st}$ column line. As a result, the column address of 5 bits could be separated into a high-level address of 2 bits and a low-level address of 3 bits. While addressing a specific column line, the column pre-decoding mechanism is performed to decode which groups is the specific column line located by the high-level address, and then the column pre-decoding mechanism is performed to decodes which order of the groups is the specific column line indicates by the low-level address.

For example, after performing the column pre-decoding mechanism to a column address of a specific column line, the specific column line belongs to the $3^{rd}$ column line of the second group, thus the specific column line of the $11^{th}$ column line of the 32 column lines is further pre decoded. That is to say, when implementing the column decoding circuit, a column pre-decoder is used to decode the high-level address and the low-level address of the column address. Then, a column decoder is used to locate a specific column line. After the specific column line is located, a sense amplifier is used to electronically connect to the specific column line by a column multiplex mechanism. However, other column lines wouldn't be electrically connected to the sense amplifier.

Figure 3:
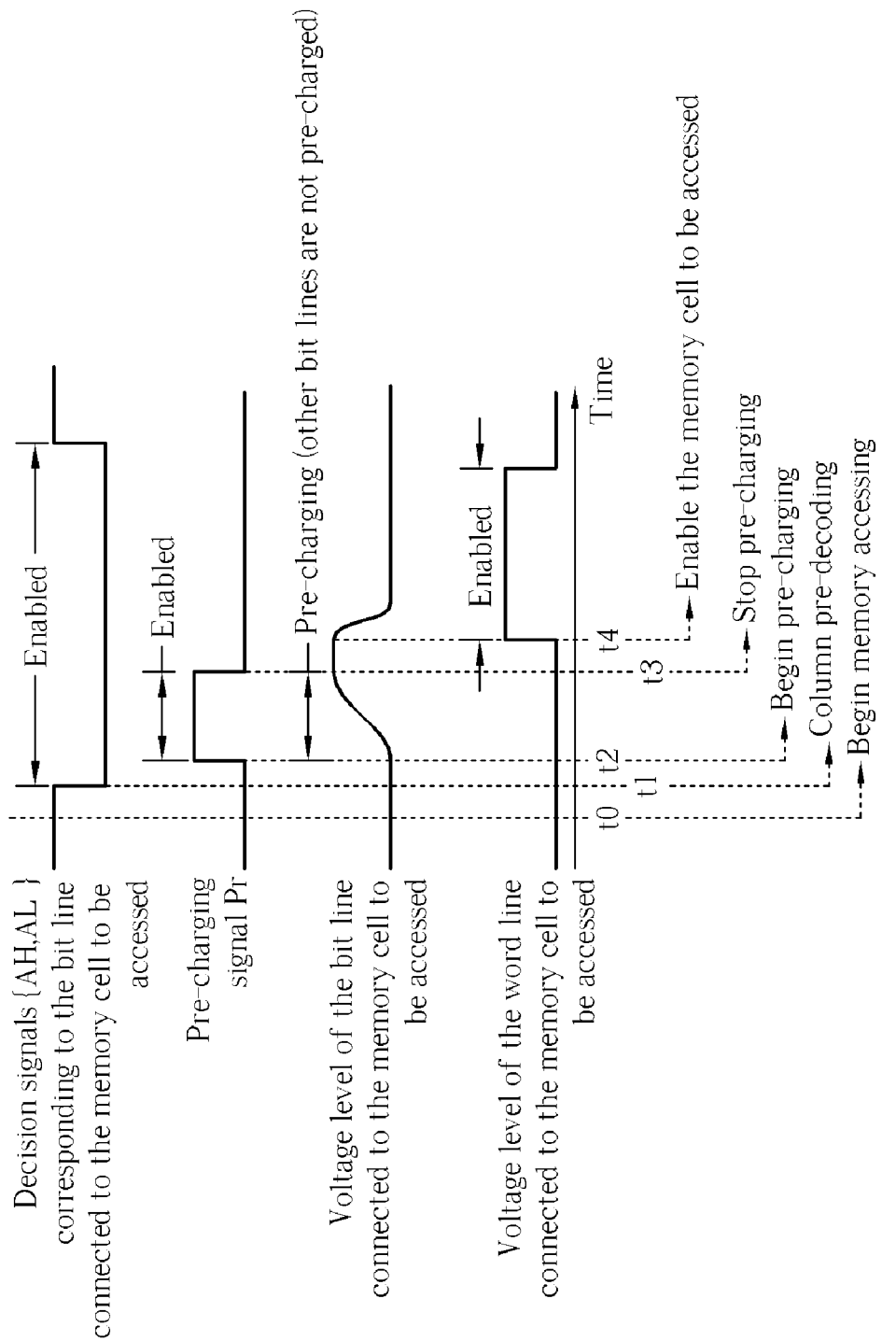
FIG. 3 is a graph showing waveform timing of related signals of the memory circuit under operation in the present invention.

Please refer to FIG. 3 and FIG. 2. FIG. 3 is a timing diagram of the related signal waveforms in the present invention. The horizontal axis represents the time and the vertical axis represents voltage level. The timing diagram of FIG. 3 is described as following.

An objective memory cell with addressed is going to be accessed. At time t0, the master module 32 transmits the column address of the objective memory cell to the column pre-decoder 34. At time t1, the column pre-decoder 34 pre decodes the column address and accordingly provides the corresponding selection signal {AH(~), AL(~)} to each column line (bit line). It's say that the column pre-decoder 34 enables the selection signal of the objective memory cell at time t1. At time t2, the master module 32 asserts an enabled pre-charge signal Pr. Due to the enabled selection signal and the pre-charge signal Pr, the control unit Hc of the objective memory cell controls the corresponding pre-charge unit Hp to pre-charge the column line of the objective memory cells. The column lines of other nonobjective memory cells wouldn't be pre charged due to the selection signals are not enabled, even if the enabled pre-charge signal Pr is asserted at t2. Therefore, power consumption is prevented from pre charging the column lines of nonobjective memory cells.

In FIG. 3, assume the column line of the objective memory cell is at a low voltage level before time t0. After being pre-charged for a while, the column line is at a high voltage level. At time t3, the master module 32 disables the pre-charge signal Pr to complete the pre-charge mechanism. At time t4, the word line of the objective memory cell is enabled; so that the objective memory cell drives the bit line (column line) according to the stored data of the objective memory cell. For example in FIG. 3, assume digital bit "0" is stored in the objective memory cell (i.e., a conducted n-type metal-oxide semiconductor is existed), then the memory cell is conducted and the voltage level of the bit line of the objective memory cell is lowered. The sense amplifier detects the low voltage level of the bit line and then reads out the digital bit "0" stored in the objective memory cell.

Figure 4:
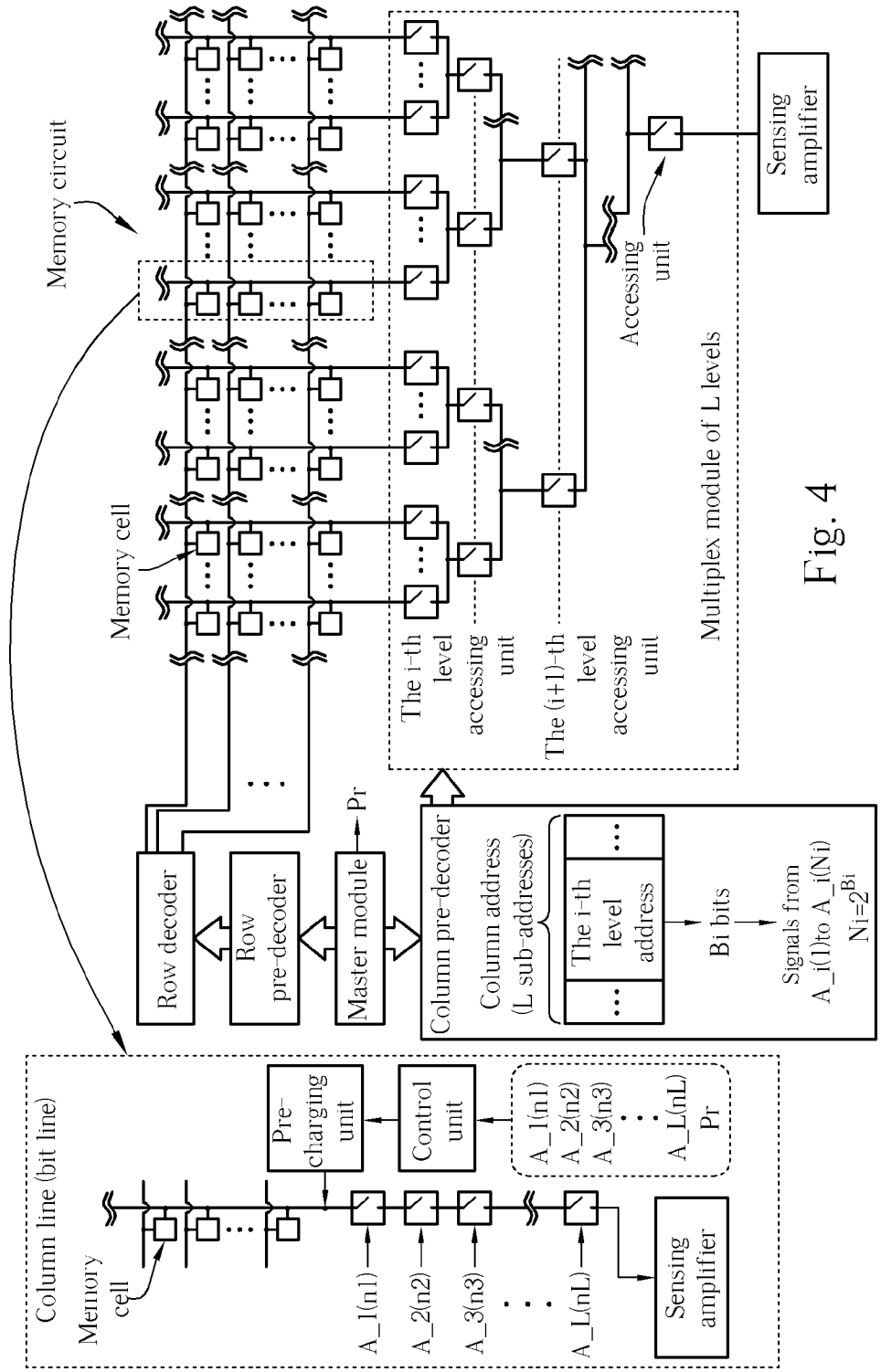
FIG. 4 is a diagram of a general application of the present invention.

FIG. 4 is a diagram of an application of the present invention.

In the memory circuit of FIG. 4, assume that the column pre-decoder separates a column address into L sub-addresses; accordingly, the memory circuit has the multiplex module with L levels.

When the column address is separated into L sub-addresses, if the i-th sub-address has Bi bits (i=1~L, and Bi is an integer), the pre-decoder generates Ni signals A_i(1)~A_i(Ni) for the sub-address after pre-decoding, wherein Ni equals to $2^{Bi}$. Accordingly, in the L-level multiplex module, every Ni accessing units of i-th level are regarded as a group and connected to a same accessing unit of (i+1)-th level. Moreover, Ni accessing units of i-th level in the same group are respectively controlled by a corresponding signal A_i(~). While pre decoding, only one of the signals from A_i(1) to A_i(Ni) is enabled so as to conduct the corresponding accessing unit of i-th level. A column line is electrically connected to the sense amplifier through the L-level accessing units. Only when all the accessing units of different levels are conducted, the corresponding column line is electrically connected to the sense amplifier.

In the present invention, each column line could correspond to a pre-charge unit and a control unit. As shown in FIG. 4, assume each levels of the L-level accessing units of the column line are respectively controlled by signals A_1(n1), A_2(n2), . . . , and A_L(nL), then the selection signal of the column line is {A_1(n1), A_2(n2), . . . , A_L(nL)}. Thus, the control unit of the column line controls the corresponding pre-charge unit according to the signals: A_1(n1), A_2(n2), . . . , A_L(nL), and the pre-charge signal Pr. Only when all the signals including the pre-charge signal Pr are enabled, the control unit controls the pre-charge unit to pre charge the column line. Otherwise, the column line wouldn't be pre charged. If the signals: A_1(n1)~A_L(nL) are all enabled which means the objective memory cell is the column line. After the pre-charge signal Pr is enabled, the column line is pre-charged. If at least one of the signals: A_1(n1)~A_L(nL) is disabled which means the objective memory cell is not on the column line, thus even if the pre-charge signal Pr is enabled, the pre-charge mechanism wouldn't be preformed and the unnecessary power consumption is thus prevented.

The memory cells, the accessing units, the control units, and the pre-charge units could be other types of circuits. For example, in FIG. 2, the accessing unit could be an n-type metal-oxide semiconductor; and the corresponding signals AL(~) and AH(~) with high voltage levels could enable the corresponding accessing units respectively. Accordingly, the control unit performs a NAND operation of the signals AL(~), AH(~), and the pre-charge signal Pr. Moreover, the accessing unit could be a transmission gate. The control unit used to control the pre-charge unit according to the selection signal and the pre-charge signal. And other logical circuits which can achieve the objections could be the possible implementations. Memory cell could also be other types of read-only memory cells. For example, stored digital bits of memory cells are depended on the existing of p-type metal-oxide semiconductors. Or, in some kinds of read-only memory cells with each memory cell has a metal-oxide semiconductor, and the stored digital bits of the memory cell is depended on whether the drain of the metal-oxide semiconductor is connected to a corresponding bit line. Moreover, the memory cells could also be read-only memory cells with a floating gate, thus, the conductivity of the memory cell is determined by various amounts of charge of the floating gate; and the digital bits "0" or "1" are thus stored accordingly.

In summary, when data accessing(or memory accessing) in the memory circuit, different column lines can be selectively pre-charged or not pre-charged according to the column pre-decoding results in the present invention. Only the column line of the objective memory cell is pre-charged, whereas other column lines are not pre-charged. Compared to pre-charge all column lines in the prior-art memory circuits, the column pre-decoding mechanism and the selective pre-charge mechanism are integrated in the present invention. The power consumption can also be efficiently decreased without influencing the memory accessing. Therefore, the memory circuit of the present invention can be utilized for various applications consuming lower power.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory circuit comprising:
a plurality of memory cells for respectively storing data;
a plurality of column lines for respectively connecting at least one memory cell;
a plurality of pre-charge units, each pre-charge unit corresponds to one of the column lines, when one of the pre-charge unit is enabled, the pre-charge unit charges the corresponding column line; when the pre-charge unit is disabled, the pre-charge unit stops charging the corresponding column line;
a column pre-decoder, providing a corresponding selection signal for each column line to indicate whether the column line is connected to a objective memory cell when the objective memory cell is to be accessed;
a sense amplifier, electrically connected to the objective memory cell for receiving and sensing the stored data;
a plurality of control units, respectively corresponding to one of the column lines, for respectively receiving the corresponding selection signal and enabling or disabling the corresponding pre-charge unit according to the corresponding selection signal, so that the pre-charge units are independently and respectively enabled or disabled according to whether the column line is connected to the objective memory cell; and
a plurality of accessing units disposed between the column lines and the sense amplifier, wherein each accessing unit is enabled to be conducted or is disabled to be not conducted, and one of the column lines is electrically connected to the sense amplifier only when all the accessing units corresponding to the column line are conducted;
wherein the column pre-decoder records the corresponding decision signal to determine whether the accessing units corresponding to the column lines should be enabled or disabled.

2. The memory circuit of claim 1 wherein each column line comprises at least one low-level accessing unit and at least one high-level accessing unit.

3. The memory circuit of claim 1 wherein the control unit enables the corresponding pre-charge unit if the selection signal of the column line indicates all the accessing units is enabled; otherwise the control unit disables the corresponding pre-charge unit if the selection signal of the column line indicates not all the accessing units is enabled.

4. The memory circuit of claim 1 wherein the memory cells are read-only memory cells.

5. A memory circuit comprising:
a plurality of memory cells for forming a matrix by a plurality of column lines and a plurality of row lines, wherein each column line has a corresponding pre-charge unit and a corresponding control unit, the control unit controls the pre-charge unit to pre charge or not to pre charge the corresponding column line;
a column pre-decoder for providing a selection signal corresponding to one of the column lines; and
a multiplex module comprising a multi-level accessing module connected to the column line, wherein the multiplex module receives the selection signal, and determines to pre charge or not to pre charge the column line according to the selection signal.

6. The memory circuit of claim 5 wherein each level of the accessing module comprises at least one accessing unit, and wherein each column line is connected to at least one low-level accessing unit and at least one high-level accessing unit.

7. The memory circuit of claim 6 wherein each accessing unit of the corresponding column line is enabled or disabled according to the selection signal.

8. The memory circuit of claim 7 wherein when all of the accessing units of the corresponding column line are enabled, the column line is electronically connected to a sense amplifier, and the control unit controls the pre-charge unit to pre charge the column line.

9. The memory circuit of claim 5 wherein the control unit enables or disables the pre-charge unit according to the selection signal.

10. The memory circuit of claim 9 wherein the column line is pre charged when the pre-charge unit is enabled; otherwise, the column line is not pre charged when the pre-charge unit is disabled.

11. The memory circuit of claim 5 further comprising a master module for generating a pre-charge signal, wherein the pre-charge unit pre charges the column line according to the pre-charge signal.

12. The memory circuit of claim 5 further comprising a sense amplifier electronically connected to the memory cells through the multiplex module.

13. The memory circuit of claim 5 further comprising a row pre-decoder and a row decoder for selectively enabling memory cells.

14. The memory circuit of claim 4 wherein the memory cells are read-only memory cells.

15. A method for pre-charging a memory circuit, wherein the memory circuit comprises a plurality of column lines, each column line is respectively connected to at least one memory cell, and each column line is electronically connected to a sense amplifier through at least one low-level accessing unit and at least one high-level accessing unit that are independently enabled and disabled; the method comprising:
   asserting selection signals;
   independently enabling or disabling the low-level accessing unit and the high-level accessing unit according to the selection signals; and
   pre-charging the column line when the low-level accessing unit and the high-level accessing unit of the column line are both enabled.

16. A memory circuit comprising:
   a plurality of memory cells for respectively storing data;
   a plurality of column lines for respectively connecting at least one memory cell;
   a row decoder for selectively enabling memory cells;
   a master module for providing a pre-charge signal;
   a plurality of pre-charge units, each pre-charge unit corresponds to one of the column lines, when one of the pre-charge unit is enabled, the pre-charge unit charges the corresponding column line; when the pre-charge unit is disabled, the pre-charge unit stops charging the corresponding column line;
   a column pre-decoder, providing a corresponding selection signal for each column line to indicate whether the column line is connected to a objective memory cell when the objective memory cell is to be accessed; and
   a plurality of control units, respectively corresponding to one of the column lines, for respectively receiving the corresponding selection signal and enabling or disabling the corresponding pre-charge unit according to the corresponding selection signal, so that the pre-charge units are independently and respectively enabled or disabled according to whether the column line is connected to the objective memory cell;
   wherein when accessing the objective memory cell, the master module firstly provides the disabling pre-charge signal; after the column pre-decoder provides the selection signals, the master module then provides the enabling pre-charge signal, and then the row decoder enables the objective memory cell so that the stored data is transmitted to the corresponding connected column line.

* * * * *